US006970023B2

(12) United States Patent
Fedigan

(10) Patent No.: US 6,970,023 B2
(45) Date of Patent: Nov. 29, 2005

(54) MODULATED TRANSISTOR GATE DRIVER WITH PLANAR PULSE TRANSFORMER

(75) Inventor: Stephen John Fedigan, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/738,758

(22) Filed: Dec. 17, 2003

(65) Prior Publication Data

US 2005/0134357 A1 Jun. 23, 2005

(51) Int. Cl.[7] .................................................. H03B 1/00
(52) U.S. Cl. ........................ 327/109; 327/112; 327/434
(58) Field of Search ................................ 327/172–177, 327/190, 291, 300, 303, 304, 427, 434, 108–110, 327/112; 323/282, 289, 290, 351; 363/21.1, 363/41, 21.18, 64, 89, 97, 98

(56) References Cited

U.S. PATENT DOCUMENTS

| | | | | |
|---|---|---|---|---|
| 4,777,382 | A * | 10/1988 | Reingold | 307/106 |
| 4,859,921 | A * | 8/1989 | Archer | 318/599 |
| 4,937,470 | A * | 6/1990 | Zeiler | 327/109 |
| 5,036,226 | A * | 7/1991 | Tonnu et al. | 326/71 |
| 5,051,609 | A * | 9/1991 | Smith | 327/109 |
| 5,349,273 | A * | 9/1994 | Pacholok | 315/307 |
| 5,438,294 | A * | 8/1995 | Smith | 327/384 |
| 5,514,921 | A * | 5/1996 | Steigerwald | 307/125 |
| 5,675,276 | A * | 10/1997 | Goel | 327/205 |
| 5,754,732 | A * | 5/1998 | Vlahu | 388/811 |
| 5,786,687 | A * | 7/1998 | Faulk | 323/289 |
| 5,892,643 | A * | 4/1999 | Esser et al. | 361/18 |
| 5,939,927 | A * | 8/1999 | Myers | 327/390 |
| 6,229,356 | B1 * | 5/2001 | Miettinen | 327/108 |
| 6,473,317 | B1 * | 10/2002 | Simopoulos | 363/21.06 |
| 6,674,658 | B2 * | 1/2004 | Mao et al. | 363/127 |
| 6,724,642 | B2 * | 4/2004 | Brkovic | 363/21.08 |
| 6,791,851 | B2 * | 9/2004 | Brkovic | 363/56.03 |

OTHER PUBLICATIONS

Coreless Printed Circuit Board (PCB) Transformers for Power MOSFET/IGBT Gate Drive Circuits, Hui, Chung, Tang, IEEE Transactions on Power Electronics, vol. 14, No. 3, May 1999.

* cited by examiner

*Primary Examiner*—Timothy P. Callahan
*Assistant Examiner*—Hai L. Nguyen
(74) *Attorney, Agent, or Firm*—J. Dennis Moore; W. James Brady, III; Frederick J. Telecky, Jr.

(57) ABSTRACT

Disclosed are methods and apparatus for isolating and driving a power supply or power amplifier circuit. The circuits and methods provide for using a modulated PWM input signal and its complement to drive one or more core-less transformers providing an isolated power supply circuit output signal reproducing the PWM input signal. Preferred methods of the invention are disclosed in which steps for receiving and modulating a PWM input signal and its complement are included. In further steps, the modulated PWM signal and its complement control an isolated output driver to provide a power supply circuit output signal reproducing the PWM input signal. Embodiments of the invention are disclosed in which a circuit is configured for receiving a PWM input signal, providing isolation, and outputting a PWM output signal. The circuits include modulators for modulating a PWM input signal and its complement. Pulse transformer stages deliver the modulated PWM signal and its complement to the respective gates of power transistors of gate driver output stages. At an output terminal, a PWM output signal responsive to the PWM input signal is produced.

28 Claims, 5 Drawing Sheets

MODULATED TRANSISTOR GATE DRIVER WITH PLANAR PULSE TRANSFORMER

TECHNICAL FIELD

The invention relates to electronics and electronic circuits. More particularly, the invention relates to electronic circuits using a transformer and transistor gate driver for the isolation and control of power supplies in electronic systems.

BACKGROUND OF THE INVENTION

In some electronic circuits, isolation of one portion of a circuit from others is required. Transformers are widely used for isolation in AC circuits. Conventional cored pulse transformers have a primary winding and a secondary winding and work on the principle that energy can be efficiently transferred by magnetic induction from one winding to another winding by a varying magnetic field produced by the alternating current. Pulse transformers are used extensively for isolation, for example in MOSFET gate driver circuits, but have several serious shortcomings. Conventional cored pulse transformers are expensive, bulky, and can vary significantly from unit to unit in terms of electrical characteristics.

Core-less PCB transformers use primary and secondary windings on opposing sides of a PC board. Such transformers lack a magnetic core and have a relatively small number of windings, with the result that they have a relatively low magnetizing inductance and higher leakage inductance. The use of core-less PCB transformers can save expense, ensure greater uniformity among units, and avoid saturation problems. However, the use of core-less PCB transformers for isolation in circuits offers technical challenges as well. To avoid high primary side drive current associated with the low magnetizing inductance, these transformers are typically operated at switching frequencies within a range of about 7–11 MHz. Since most power transistors cannot be switched at such high frequencies, a PWM waveform cannot practically be sent directly across these core-less transformers. In order to address this problem, it is known in the arts to differentiate a PWM input signal waveform by subtracting it from a delayed version of itself. This produces a positive pulse indicative of the rising edge of the PWM input and a negative pulse indicative of the falling edge. These pulses are fed into the primary side of the transformer. A latch is used on the secondary side of the transformer. The positive pulse sets the latch and the negative pulse resets it, thus reconstructing the original PWM input signal. Although ideally this approach would substantially reproduce the input PWM signal at the output, it is very difficult to build a latch that is able to operate reliably in a noisy environment. Noise events can act to set or reset the latch. Such accidental operation of the latch can result in damage to the circuit. An additional problem is that inductive flyback from the pulse transformer can cause the latch to reset immediately after being set, or vice versa, also potentially causing damage to the circuit.

Due to these and other problems, improved pulse transformer driver circuits would be useful and advantageous in the arts.

SUMMARY OF THE INVENTION

In carrying out the principles of the present invention, in accordance with preferred embodiments thereof, circuits and methods for driving and isolating a power supply circuit use a modulated PWM signal and its complement to drive one or more core-less transformers, providing an isolated power supply circuit output signal substantially identical to the PWM input signal.

According to one aspect of the invention, a method of driving and isolating a power supply circuit includes steps of receiving and modulating a PWM input signal and its complement. In further steps, the modulated PWM signal and its complement are used to control an isolated output driver to provide a power supply circuit output signal reproducing the characteristics of the PWM input signal.

According to another aspect of the invention, a method of driving isolating a power supply circuit includes steps of receiving a PWM input signal, modulating the PWM signal to produce a modulated PWM signal and a modulated PWM signal complement, and providing a rising edge pulse to the modulated PWM signal and its complement. The signals thus produced are subsequently applied to respective pulse transformers in order to control the isolated power supply circuit output responsive to the PWM input signal.

According to yet another aspect of the invention, a transistor gate driver circuit is disclosed. According to preferred embodiments, the circuit is configured for receiving a PWM input signal, providing isolation, and outputting a PWM output signal. The circuits include modulators for modulating the PWM input signal and its complement. Pulse transformer stages deliver the modulated PWM signal and its complement to the respective gates of power transistors of gate driver output stages. At an output terminal, a PWM output signal responsive to the PWM input signal is produced.

According to further aspects of the invention, additional embodiments of the invention are disclosed in which methods and circuits are used to provide isolated drivers according to the invention alternatively using active-on/passive-off and passive-on/active-off approaches.

The invention provides technical advantages over the prior art including but not limited to improvements in reliability and a low susceptibility to noise. Advantages in cost are also achieved. These and other features, advantages, and benefits of the present invention can be understood upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to the references in the figures unless otherwise noted. Descriptive and directional terms used in the written description such as first, second, left, right, top, bottom, and so forth refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the preferred embodiments of the invention provide new, reliable, isolated gate driver circuits. The preferred embodiments of the invention use modulation techniques to pass signals across a core-less PCB transformer.

Figure 1:
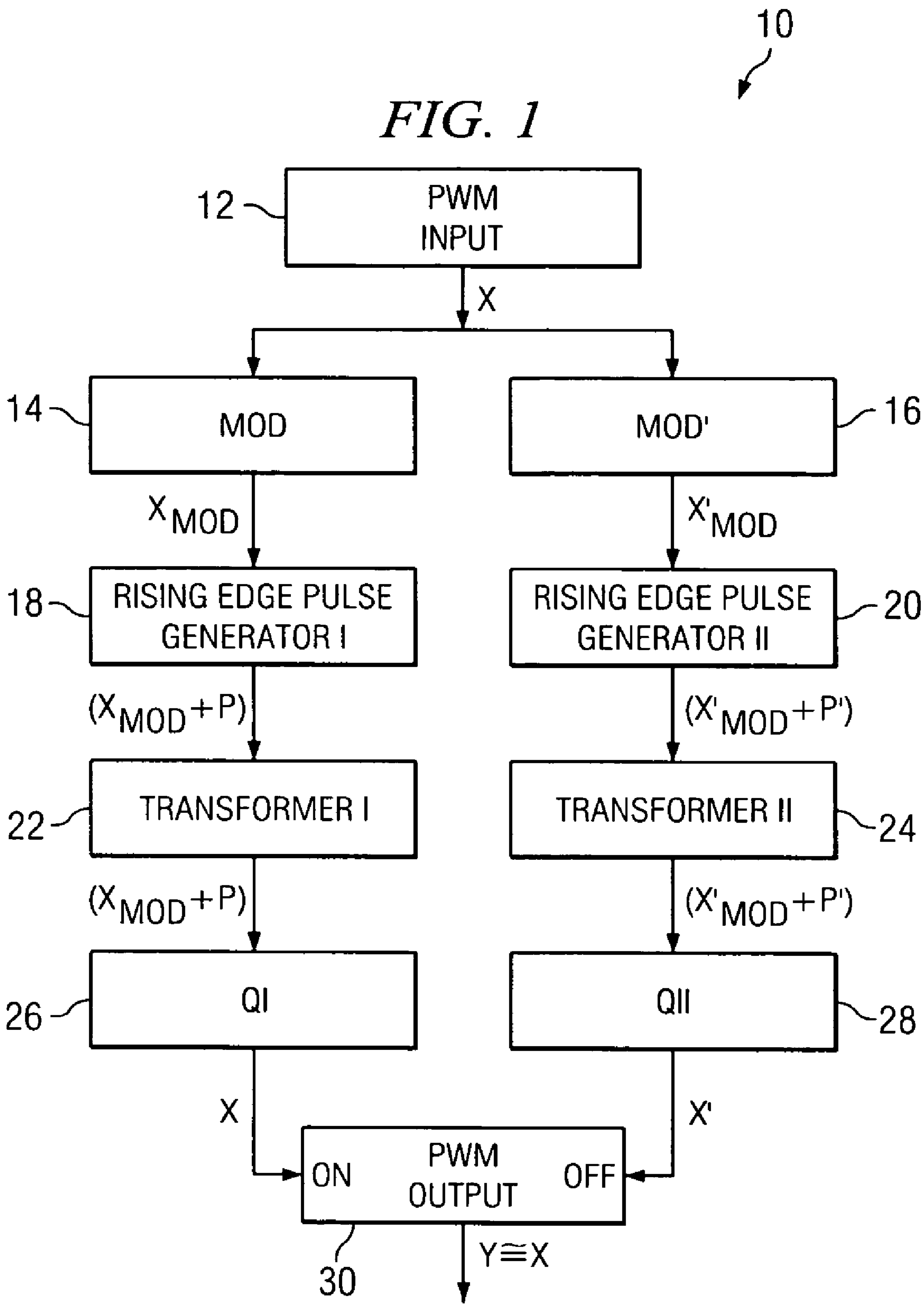
FIG. 1 is a flow diagram illustrating an example of a preferred embodiment of a method according to the invention.

An illustration of steps in a method 10 of the invention is shown in FIG. 1. As indicated at box 12, a PWM input signal denoted X is received. The PWM input signal necessarily has a complement, herein denominated X'. The PWM signal X is modulated 14 to produce a modulated PWM signal $X_{mod}$. Additionally, the PWM signal complement X' is modulated 16, producing a modulated PWM signal complement $X'_{mod}$. Preferably, as shown at steps 18 and 20 respectively, the modulated PWM signal $X_{mod}$ and its complement $X'_{mod}$ are each provided with a rising edge pulse P, P'. The rising edge pulses P, P', ensure clearly defined rising edges in the modulated signals, $X_{mod}$, $X'_{mod}$ to facilitate switching as further described herein. The rising-edge-enhanced modulated PWM signal, ($X_{mod}$+P), is preferably fed into a first transformer 22. Similarly, the rising-edge-enhanced modulated signal complement, ($X'_{mod}$+P'), is fed into a second transformer 24. The first and second transformers 22, 24, are preferably core-less PCB transformers, providing effective isolation of the output 30 from the input 12. A first transistor 26 is configured for switching “on” responsive to the saturation of the gate by the signal ($X_{mod}$+P) from the first transformer 22. Also, a second transistor 28, preferably of similar construction but opposite polarity, is configured for switching “off” responsive to the complementary signal ($X'_{mod}$+P') from the second transformer 24. Accordingly, the PWM output 30 is regulated in such a way as to provide a PWM output signal Y that is essentially a reproduction of the PWM input signal X. The PWM output 30 is connected to a power transistor, preferably a MOSFET or IGBT.

Those skilled in the arts should take note that the preferred method shown and described may be implemented with various modifications. For example, either the active “on” or active “off” provided by the respective transistors 26, 28, may be omitted, relying instead on a passive “on” or “off”. In another alternative embodiment, one or both of the rising edge pulses P, P' may be omitted. Such alternative embodiments may be used independently or in combination to implement a functional circuit in suitable applications without departure from the invention.

Figures 2A, 2B, 2C, 2D, 2E:
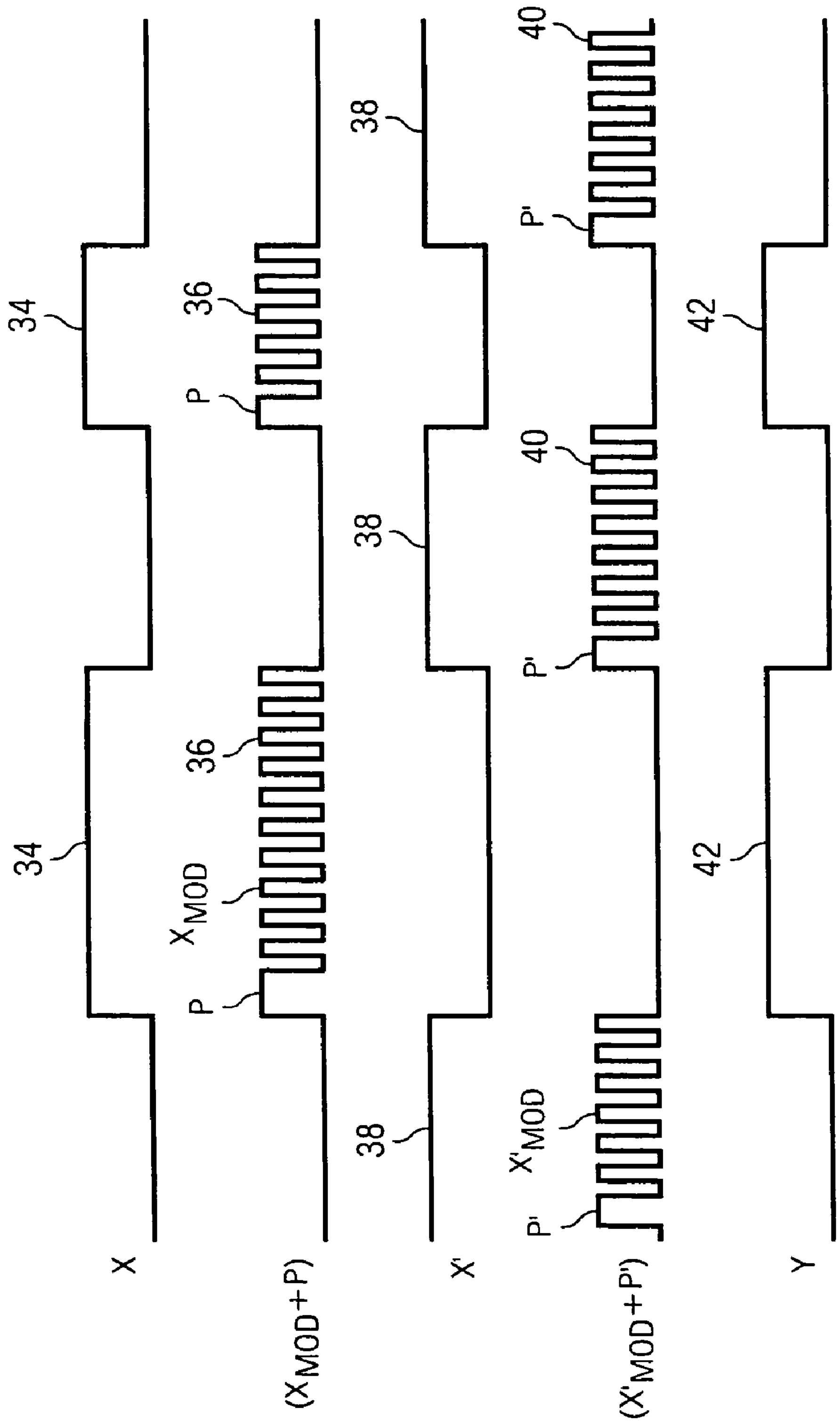
FIG. 2A through FIG. 2E are depictions of representative examples of waveforms for illustrating steps in preferred methods according to the invention.

Now referring primarily to FIG. 2A through FIG. 2E, an additional view of the operation of the invention is provided. FIG. 2A provides a representation of an exemplary PWM input signal X. For the purposes of example, arbitrary pulses 34 are shown. FIG. 2B illustrates the modulated PWM signal $X_{mod}$, exhibiting modulated pulses 36 with a rising edge pulse P added, ($X_{mod}$+P). FIG. 2C depicts the compliment X' of the PWM input signal X of FIG. 2A, showing pulses 38 complementary to those of the PWM input signal X. FIG. 2D shows the modulated PWM signal complement $X'_{mod}$, having modulated pulses 40 to which a rising edge pulse P' has also been added, ($X'_{mod}$+P'). In FIG. 2E, the PWM output signal Y is shown to be a reproduction of the PWM input signal X of FIG. 2A.

Figure 3:
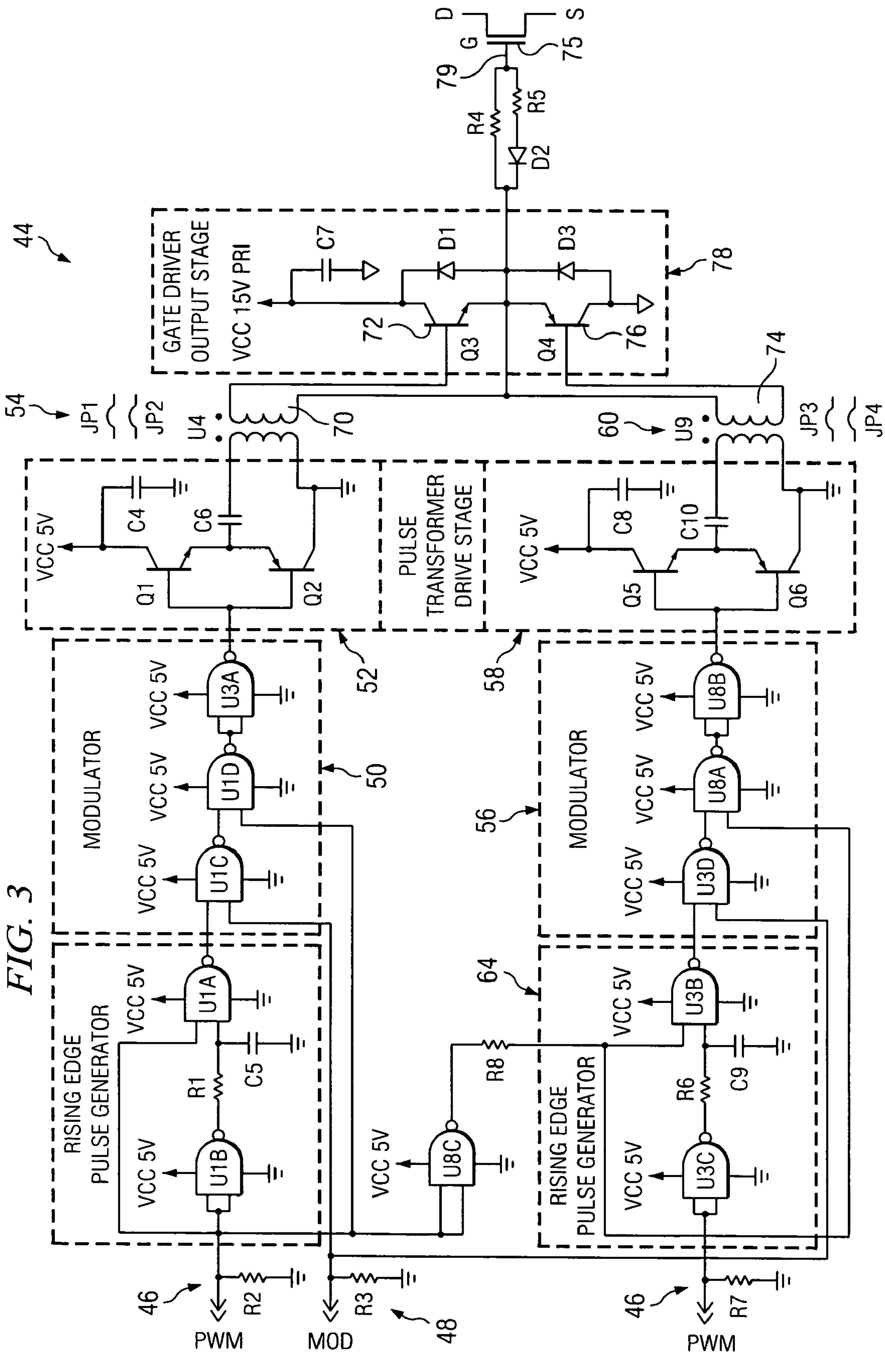
FIG. 3 is a schematic circuit diagram illustrating an example of a preferred embodiment of the invention.

A schematic diagram of a preferred embodiment of the invention is shown in FIG. 3. The modulated gate driver circuit 44 shown includes an input terminal 46 for receiving the PWM input signal from an external source. A modulation signal is also accepted at a modulation input terminal 48. The modulation signal is preferably used to modulate both the PWM input signal and its complement. The PWM input signal is modulated at a first modulator 50, and the modulated PWM signal is used as the set signal at a first pulse transformer driver stage 52. The first pulse transformer driver stage 52 includes a core-less PCB pulse transformer 54. A complement of the PWM input signal is derived at the input terminal 46 and is modulated at a second modulator 56. The modulated PWM signal compliment is used as a reset signal at a second pulse transformer driver stage 58. The second pulse transformer driver stage 58 also includes a core-less PCB pulse transformer 60.

Further referring primarily to FIG. 3, preferably, a first rising edge pulse generator 62 provides a pulse which is “or-ed” with a free running oscillator. The resulting signal is then gated by the PWM input signal. The use of the rising edge pulse in this manner avoids a random delay between the rising edge of the PWM signal and the first rising edge the modulated PWM signal. A second rising edge generator 64 is preferably applied to the modulated PWM signal compliment as well. Artisans will appreciate that the gates shown in the circuit 44 may be substituted with their logical equivalents without departing from the principles of invention. Of course, functional alternative versions of the invention may also be implemented omitting one or both of the rising edge pulse generators.

As described above, both the modulated PWM signal and the modulated PWM signal complement are fed into respective drive stages 52, 58. There are many equivalent circuit components which may be used by those skilled in the arts to implement the modulators 50, 56 and drive stages 52, 58 within the scope of the invention, so long as the modulated PWM signals are each applied to the primary sides 66, 68 of their respective core-less PCB transformers 54, 60. Of course, many alternative core-less PCB transformers may also be used.

On the secondary side 70 of the first PCB transformer 54, the modulated PWM signal is preferably tied to a first gated transistor 72. Preferably, an NPN type BJT 72 is used, with the secondary side 70 of the first transformer 54 coupled between the base and emitter. In this arrangement, the rising edge of the modulated PWM signal saturates the NPN 72, causing charge to be dumped on the gate of a power transistor 75, preferably as MOSFET, bringing the MOSFET 75 into conduction. Successive high frequency pulses of the modulated PWM signal maintain the charge on the gate of the power transistor 75.

In the same manner, at the second PCB transformer 60, the modulated PWM signal complement emerges from the secondary side 74. The secondary winding 74 is tied to a second transistor 76, preferably, a PNP type BJT 76. With the secondary side 74 of the second PCB transformer 60 coupled between the base and emitter, the rising edge of the modulated PWM signal complement saturates the PNP 76, removing the charge between the gate and the source of the power transistor 75. Successive pulses of the modulated PWM signal complement prevent any charge injected by noise pulses from accumulating at the gate of the power transistor 75.

Thus, the driver transistors 72, 76 coupled to their respective PCB transformers 54, 60 are preferably used to control a driver output stage 78 to provide a PWM output signal at the output terminal 79. Although the invention is shown and described using examples implemented with MOSFETs, other transistors with suitable operating characteristics, for example IGBTs, may be substituted. It should also be appreciated from an understanding of description and figures, that the invention may also be used to advantage in alternative implementations using passive rather than active turn-on or turn-off in suitable applications.

Figure 4:
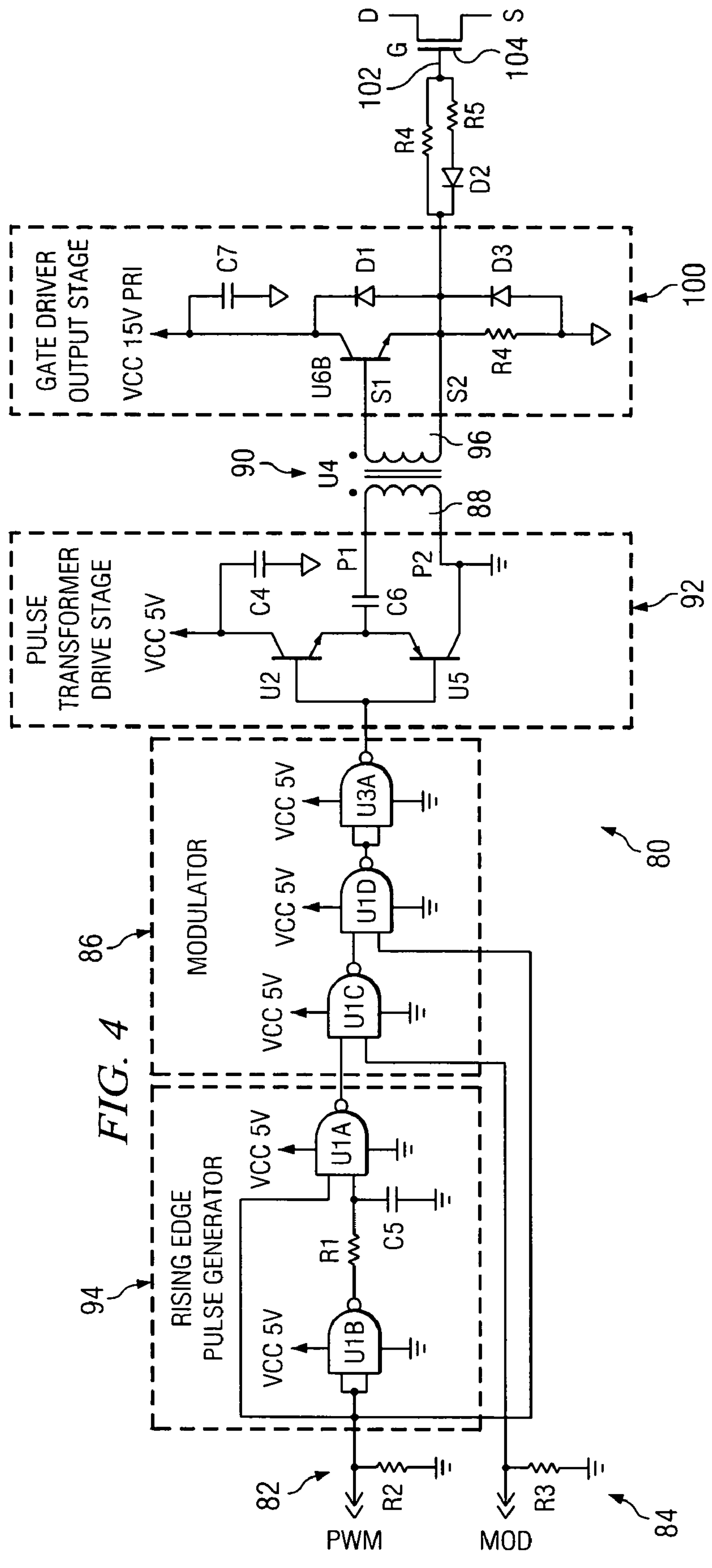
FIG. 4 is a schematic circuit diagram illustrating an example of an alternative embodiment of the invention.

FIG. 4 depicts an example of an alternative embodiment of a modulated gate driver circuit 80 according to the invention using an active turn-on, passive turn-off topology. An input terminal 82 accepts a PWM signal, and a modulation input terminal 84 accepts a modulation signal. The PWM input signal is modulated at a modulator 86, and the modulated PWM signal is used as the set signal at the primary side 88 of a core-less PCB pulse transformer 90 in a pulse transformer driver stage 92. Preferably, a rising edge pulse generator 94 provides a pulse at the rising edge of the modulated PWM signal. The use of a rising edge pulse is preferred in order to prevent a random delay between the rising edge of the PWM signal and the first rising edge of the modulated PWM signal. Where appropriate for the application, the rising edge pulse generator 94 may be omitted. The secondary side 96 of the PCB transformer 90 is coupled to a transistor 98, preferably an NPN BIT 98. The secondary side 96 of the transformer 90 is coupled between the BIT 98 base and emitter. In this configuration, the rising edge of the modulated PWM signal saturates the BIT 98, causing charge to build up on the gate of a power transistor 104, bringing the power transistor 104, preferably a MOSFET, into conduction. The successive high frequency pulses of the modulated PWM signal maintain the charge on the gate of the power transistor 104, causing the output stage 100 to output a PWM signal at the output node 102. Following the final pulse of the modulated PWM signal, the charge on the MOSFET 104 dissipates through the pull-down resistor, and the gate switches off.

Figure 5:
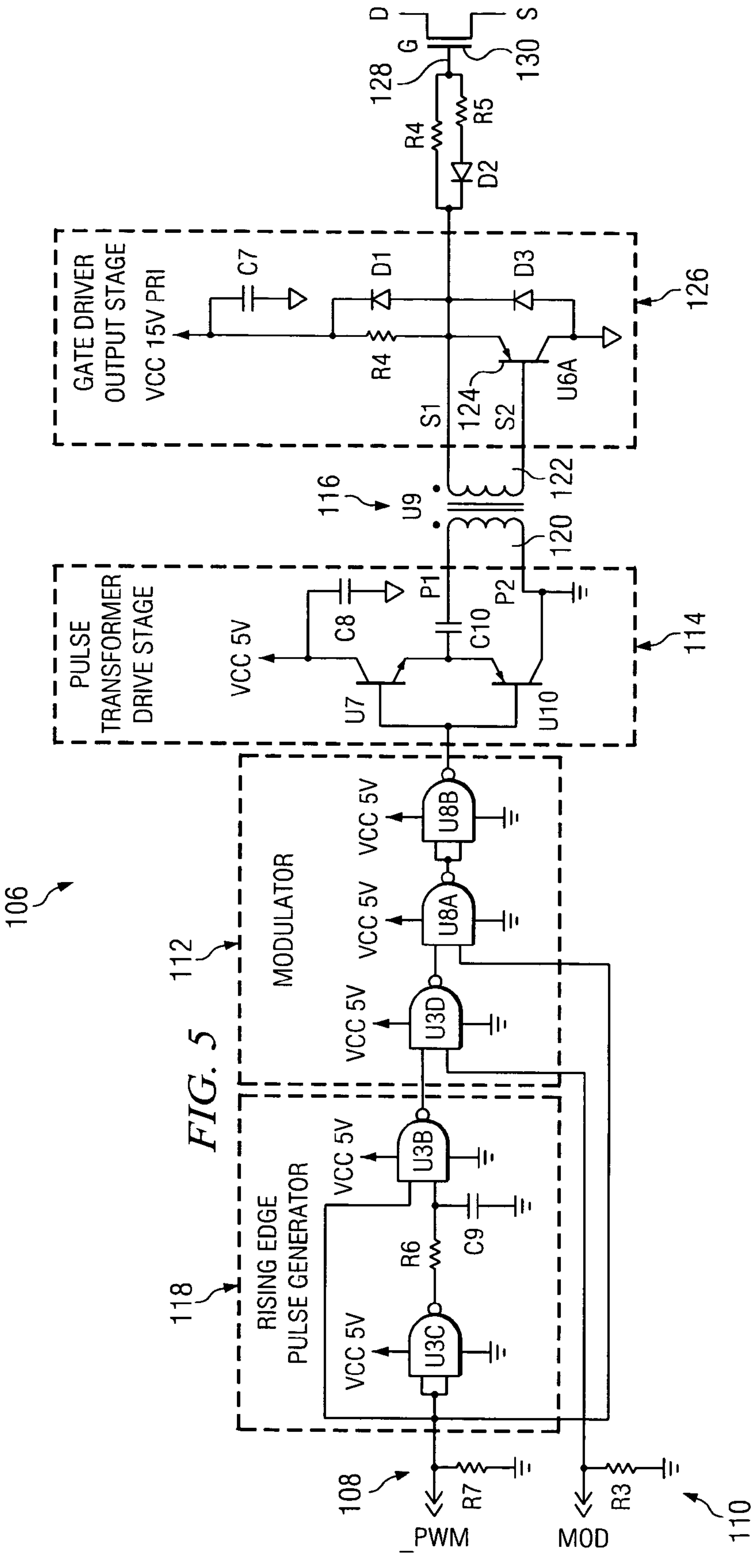
FIG. 5 is a schematic circuit diagram illustrating an example of an alternative embodiment of the invention.

FIG. 5 illustrates an example of an alternative embodiment of a modulated gate driver circuit 106 according to the invention using a passive turn-on, active turn-off topology. A complement of the PWM input signal is derived at the input terminal 108 and modulating signal from a modulation input terminal 110 is applied at a modulator 112. The modulated PWM signal compliment is used as a reset signal at a pulse transformer driver stage 114. The pulse transformer driver stage 114 has a core-less PCB pulse transformer 116. The circuit 106 also preferably includes a rising edge pulse generator 118 for applying an extra pulse to the modulated PWM signal compliment. The rising edge pulse is used to prevent a random delay between the rising edge of the PWM signal complement and the first rising edge of the modulated PWM signal complement. The invention may also be implemented without the rising edge pulse generator 118. At the pulse transformer 116, the modulated PWM signal complement enters at the primary side 120 and emerges from the secondary side 122, which is coupled to a transistor 124 in an output stage 126. Preferably, the transistor 124 is a PNP type BJT. With the secondary side 122 of the second PCB transformer 116 coupled between the base and emitter, the rising edge of the modulated PWM signal complement cuts off the power transistor 130, removing the charge between the gate and the source and causing the signal to turn off at the output 128. Successive pulses of the modulated PWM signal complement prevent any charge injected by noise pulses from accumulating at the gate of the power transistor 130, thus preventing an erroneous signal to appear at the output terminal 128. Turn-on in this circuit 106 is passive, using a pull-up resistor R4. That is, in the absence of a reset signal at the power transistor 130, the output stage 126 is allowed to remain in the "on" state.

Thus, the invention includes methods and apparatus for providing modulated transistor gate driver circuits using planar pulse transformers for isolation. While the invention has been described with reference to certain illustrative embodiments, the methods and apparatus described are not intended to be construed in a limiting sense. It should be appreciated that the invention may be used with power supply circuitry of various configurations or power amplifiers in a variety of applications. Artisans will appreciate that the circuits shown and described are examples only and that many components may be substituted with their logical equivalents without departing from the principles of invention. Various modifications and combinations of the illustrative embodiments as well as other advantages and embodiments of the invention will be apparent to persons skilled in the arts upon reference to the description and claims.

I claim:

1. A transistor gate driver circuit for receiving a PWM input signal, providing isolation, and outputting a PWM output signal, the circuit comprising:

an input terminal for receiving the PWM input signal;

a first modulator for modulating the PWM input signal to provide a modulated PWM signal;

a first pulse transformer drive stage for providing the modulated PWM signal to a gate of a first transistor of a gate driver output stage;

a second modulator for generating a modulated PWM signal complement from the PWM input signal;

a second pulse transformer drive stage for providing the modulated PWM signal complement to a gate of a second transistor of the gate driver output stage;

an output terminal for outputting the PWM output signal responsive to the first and second transistor gates.

2. The circuit of claim 1 wherein the first pulse transformer drive stage further comprises a core-less PCB transformer.

3. The circuit of claim 1 wherein the second pulse transformer drive stage further comprises a core-less PCB transformer.

4. The circuit of claim 1 further comprising a first rising edge pulse generator for producing a rising edge pulse in the modulated PWM signal.

5. The circuit of claim 1 further comprising a second rising edge pulse generator for producing a rising edge pulse in the modulated PWM signal complement.

6. The circuit of claim 1 wherein the first and second transistors comprise BJTs.

7. The circuit of claim 1 further comprising a power transistor coupled to the output terminal.

8. The circuit of claim 1 further comprising a MOSFET coupled to the output terminal.

9. A transistor gate driver circuit for receiving a PWM input signal, providing isolation, and outputting a PWM output signal, the circuit comprising:

an input terminal for receiving the PWM input signal;

a modulator for modulating the PWM input signal to provide a modulated PWM signal;

a pulse transformer drive stage for providing the modulated PWM signal to a gate of a transistor of a gate driver output stage; and an output terminal for outputting the PWM output signal responsive to the gate of the transistor.

10. The circuit of claim 9 wherein the pulse transformer drive stage further comprises a core-less PCB transformer.

11. The circuit of claim 9 wherein the transistor comprises a BJT.

12. The circuit of claim 9 further comprising a power transistor coupled to the output terminal.

13. The circuit of claim 9 further comprising a MOSFET coupled to the output terminal.

14. The circuit of claim 9 further comprising a rising edge pulse generator for producing a rising edge pulse in the modulated PWM signal.

15. A transistor gate driver circuit for receiving a PWM input signal, providing isolation, and outputting a PWM output signal, the circuit comprising:

a modulator for generating a modulated PWM signal complement from the PWM input signal;

a pulse transformer drive stage for providing the modulated PWM signal complement to a gate of a transistor of a gate driver output stage; and an output terminal for outputting the PWM output signal responsive to the transistor gate.

16. The circuit of claim 15 wherein the pulse transformer drive stage further comprises a core-less PCB transformer.

17. The circuit of claim 15 wherein the transistor comprises a BJT.

18. The circuit of claim 15 further comprising a power transistor coupled to the output terminal.

19. The circuit of claim 15 further comprising a MOSFET coupled to the output terminal.

20. The circuit of claim 15 further comprising a rising edge pulse generator for producing a rising edge pulse in the modulated PWM signal complement.

21. A method of isolating and driving a circuit comprising the steps of:

receiving a PWM input signal;

modulating the PWM signal to produce a modulated PWM signal and a modulated PWM signal complement; and using the modulated PWM signal and modulated PWM signal complement to provide a power supply circuit output signal reproducing the PWM input signal.

22. The method of claim 1 further comprising the step of applying the modulated PWM signal to a first pulse transformer primary winding; and using a first transformer secondary winding to turn on the circuit output.

23. The method of claim 1 further comprising the steps of applying the modulated PWM signal complement to a second pulse transformer primary winding; and using a second transformer secondary winding to turn off the circuit output.

24. The method of claim 1 wherein the circuit further comprises a power supply circuit.

25. The method of claim 1 further comprising the steps of applying the modulated PWM signal to a first pulse transformer primary winding;

applying the modulated PWM signal complement to a second pulse transformer primary winding;

using a first transformer secondary winding to turn on the circuit output; and using a second transformer secondary winding to turn off the circuit.

26. The method of claim 1 further comprising the step of providing a rising edge pulse in the modulated PWM signal.

27. The method of claim 1 further comprising the step of providing a rising edge pulse in the modulated PWM signal complement.

28. A method of driving a power circuit comprising the steps of:

receiving a PWM input signal;

modulating the PWM signal to produce a modulated PWM signal and a modulated PWM signal complement;

providing a rising edge pulse in the modulated PWM signal;

providing a rising edge pulse in the modulated PWM signal complement;

applying the modulated PWM signal and rising edge pulse to a first pulse transformer primary winding;

applying the modulated PWM signal complement and rising edge pulse to a second pulse transformer primary winding;

using a first transformer secondary winding to turn on the power circuit output; and using a second transformer secondary winding to turn off the power circuit output.

* * * * *